(12) United States Patent
Yoshida

(10) Patent No.: US 9,941,187 B2
(45) Date of Patent: Apr. 10, 2018

(54) POWER CONVERTER AND METHOD FOR MANUFACTURING POWER CONVERTER

(71) Applicant: TOYOTA JIDOSHA KABUSHIKI KAISHA, Toyota-shi, Aichi-ken (JP)

(72) Inventor: Tadafumi Yoshida, Kasugai (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 0 days.

(21) Appl. No.: 15/303,628

(22) PCT Filed: Apr. 10, 2015

(86) PCT No.: PCT/IB2015/000463
§ 371 (c)(1),
(2) Date: Oct. 12, 2016

(87) PCT Pub. No.: WO2015/159141
PCT Pub. Date: Oct. 22, 2015

(65) Prior Publication Data
US 2017/0040241 A1 Feb. 9, 2017

(30) Foreign Application Priority Data

Apr. 15, 2014 (JP) .................................. 2014-083469
Sep. 17, 2014 (JP) .................................. 2014-189299

(51) Int. Cl.
*H01L 23/34* (2006.01)
*H01L 23/40* (2006.01)
(Continued)

(52) U.S. Cl.
CPC ...... *H01L 23/4012* (2013.01); *H01L 21/4882* (2013.01); *H01L 23/40* (2013.01);
(Continued)

(58) Field of Classification Search
CPC .... H01L 23/40; H01L 23/4012; H01L 23/473
(Continued)

(56) References Cited

U.S. PATENT DOCUMENTS 4,649,990 A * 3/1987 Kurihara ............. H01L 23/3731
165/185
2006/0096299 A1* 5/2006 Mamitsu ............... H01L 23/473
62/3.2
(Continued)

FOREIGN PATENT DOCUMENTS

EP 1932407 B1 9/2011
JP 2004-180824 A 7/2004
(Continued)

Primary Examiner — Nitin Parekh
(74) Attorney, Agent, or Firm — Sughrue Mion, PLLC

(57) ABSTRACT

A power converter includes a plurality of power cards, a plurality of coolers and a pressure member. Each of the power cards houses a semiconductor element. The plurality of coolers is laminated with the power cards. The cooler includes a body, a gasket and a metal plate. The body is made of resin, and has an opening that is provided in a side surface of the cooler that faces the adjacent power card. A surface on one side of the metal plate is configured to close the opening through the gasket, and the other surface faces the power card. The pressure member is configured to apply a pressure in a laminating direction on a lamination unit. The opening is sealed by the metal plate by pressure applied by the pressure member on the lamination unit.

8 Claims, 13 Drawing Sheets

(51) Int. Cl.
    *H01L 23/473*     (2006.01)
    *H01L 25/11*     (2006.01)
    *H01L 21/48*     (2006.01)
    *H01L 25/00*     (2006.01)
    *H02M 7/00*     (2006.01)
    *H02M 7/537*     (2006.01)

(52) U.S. Cl.
    CPC .......... *H01L 23/473* (2013.01); *H01L 25/117* (2013.01); *H01L 25/50* (2013.01); *H02M 7/003* (2013.01); *H02M 7/537* (2013.01); *H01L 2924/0002* (2013.01)

(58) Field of Classification Search
    USPC ........................................ 257/713, 714, 719
    See application file for complete search history.

(56) References Cited

U.S. PATENT DOCUMENTS

| | | |
|---|---|---|
| 2009/0213547 A1 | 8/2009 | Schulz-Harder et al. |
| 2009/0321924 A1 | 12/2009 | Funakoshi et al. |
| 2011/0299265 A1* | 12/2011 | Nakatsu ................. B60L 11/14 361/820 |
| 2011/0316142 A1* | 12/2011 | Noritake ............... H01L 23/051 257/713 |
| 2011/0316143 A1* | 12/2011 | Noritake ............... H01L 21/565 257/713 |
| 2011/0318884 A1* | 12/2011 | Noritake ............... H01L 21/565 438/122 |
| 2012/0212907 A1 | 8/2012 | Dede |
| 2013/0154084 A1* | 6/2013 | Kadoguchi ......... H01L 23/3121 257/717 |
| 2017/0084515 A1* | 3/2017 | Shintani ................. H01L 23/28 |

FOREIGN PATENT DOCUMENTS

| | | |
|---|---|---|
| JP | 2006-165534 A | 6/2006 |
| JP | 2010010504 A | 1/2010 |
| JP | 2012-009568 A | 1/2012 |
| JP | 2012-238681 A | 12/2012 |
| JP | 2015-213143 A | 11/2015 |
| WO | 2015/159141 A1 | 10/2015 |

* cited by examiner

F I G . 6
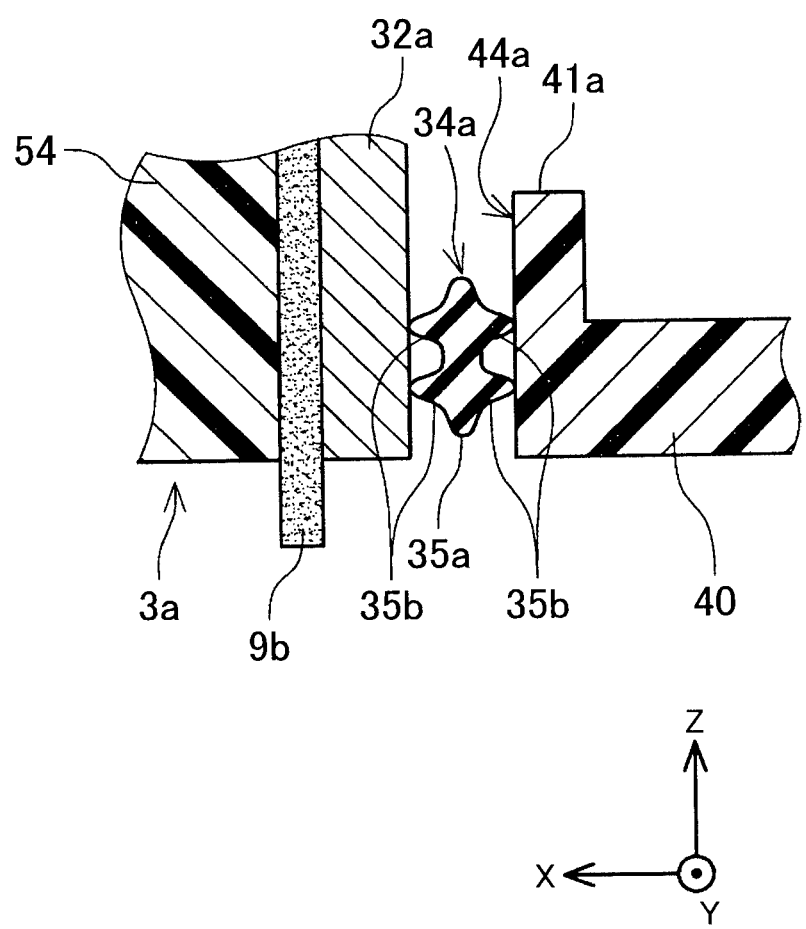

F I G. 12B
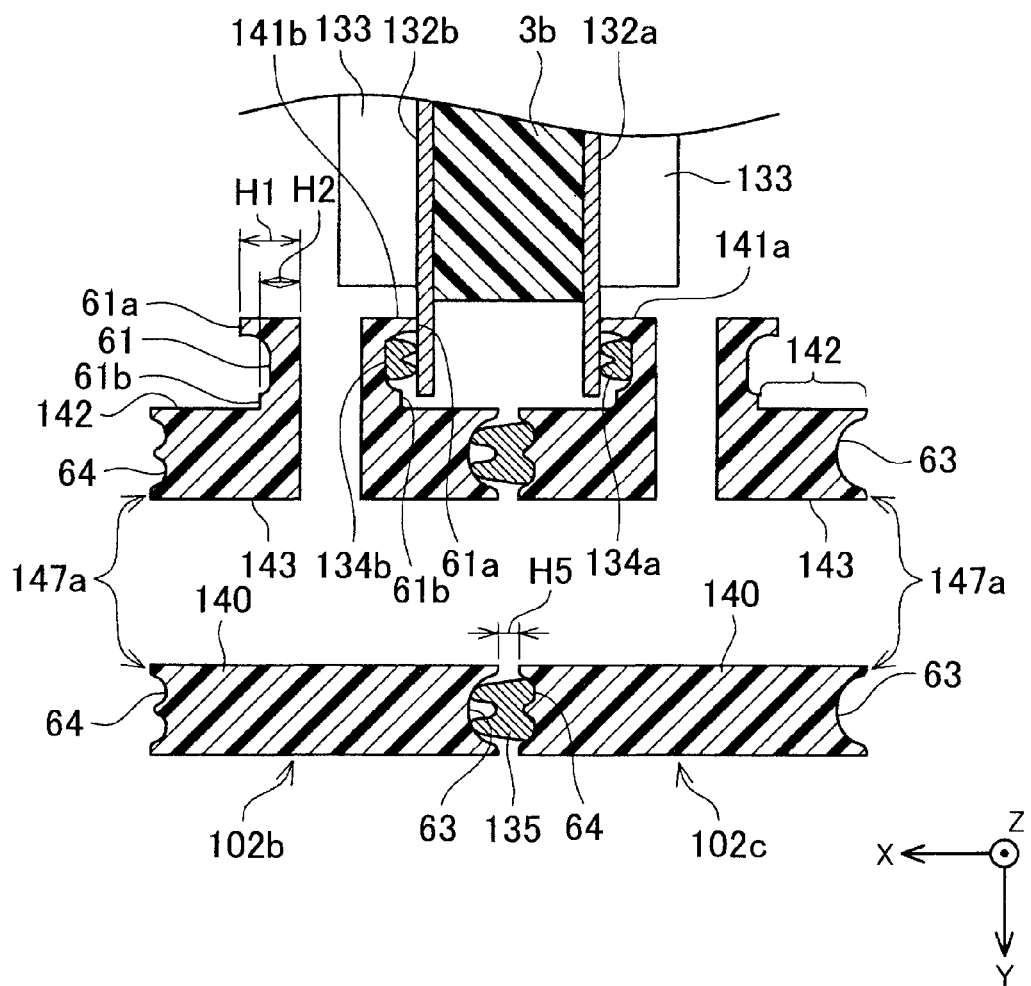

POWER CONVERTER AND METHOD FOR MANUFACTURING POWER CONVERTER

BACKGROUND OF THE INVENTION

1. Field of the Invention

The invention relates to a power converter and a method for manufacturing the power converter. The invention especially relates to a power converter, in which a plurality of power cards that respectively house semiconductor elements, and a plurality of coolers are laminated, and to a method for manufacturing the power converter.

2. Description of Related Art

A power converter generates a large amount of heat. A switching element, or a semiconductor element for power conversion, which is called a power element, generates a particularly large amount of heat. For example, a power converter that supplies power to an electric vehicle driving motor is provided with a large number of switching elements, and thus generates an especially large amount of heat.

Japanese Patent Application Publication No. 2012-238681 (JP 2012-238681 A), Japanese Patent Application Publication No. 2006-165534 (JP 2006-165534 A), and Japanese Patent Application Publication No. 2012-009568 (JP 2012-009568 A) disclose techniques for aggregating a large number of switching elements having a large amount of heat generation and cooling the switching elements effectively. In the technique disclosed in JP 2012-238681 A, a lamination unit is employed, in which a plurality of power cards housing switching elements, and a plurality of coolers are provided, and the power cards and the coolers are laminated alternately. Each of the flat plate-type power cards is cooled by making the coolers abut on both surfaces of each of the power cards. JP 2012-238681 A discloses that a body of the cooler is aluminum. It is known that this type of cooler is easily manufactured by pressing metal having high thermal conductivity (typically aluminum). The lamination unit is housed in a power converter case while applying pressure on the lamination unit in the laminating direction of the lamination unit in order to improve efficiency of heat transfer from the power card to the cooler. In JP 2012-238681 A, pressure is applied to the lamination unit by inserting a leaf spring between an end surface of the lamination unit and an inner side surface of the case.

In JP 2006-165534 A and JP 2012-009568 A, a lamination unit is disclosed, in which a power card is assembled into a cooler having a resin body inside of which flows refrigerant, and the coolers are laminated. In this lamination unit, unlike the technique described in P 2012-238681 A, refrigerant flows around the power card. Therefore, cooling performance is high.

In Japanese Patent Application Publication No. 2004-180824 (JP 2004-180824 A), an example of a gasket is disclosed.

In the lamination unit described in JP 2012-238681 A, the body of the cooler is manufactured from sheet metal from the viewpoint of ease of forming and thermal conductivity. However, when pressure is applied on the laminating direction on the cooler manufactured from sheet metal, the cooler is deformed greatly, causing a large position error of the power card.

The techniques described in JP 2006-165534 A and JP 2012-009568 A realize high cooling performance without a need for such a cooler described in JP 2012-238681 A by exposing the power card directly to a flow of refrigerant.

However, since the power card is directly exposed to a flow of refrigerant, it is difficult to take measures to waterproof the power card.

SUMMARY OF THE INVENTION

Techniques disclosed in this specification provide a power converter, which has high strength even with a structure where a cooler and a power card are laminated, and ensures cooling performance for the power card. This specification also provides a method for manufacturing the power converter.

A power converter disclosed in this specification has the following structure. The power converter includes a plurality of power cards, a plurality of coolers and a pressure member. Each of the power cards houses a semiconductor element. The plurality of coolers is laminated with the power cards, and each of the coolers faces the power card. The cooler includes a body, a gasket and a metal plate. The body is made of resin, and the body has an opening that is provided in a side surface of the cooler that faces the adjacent power card. A surface on one side of the metal plate is configured to close the opening through the gasket, and the other surface of the metal plate faces the power card. The pressure member is configured to apply a pressure in a laminating direction on a lamination unit. The plurality of power cards and the plurality of coolers are laminated in the lamination unit. The opening is sealed by the metal plate by pressure applied by the pressure member on the lamination unit.

The power converter stated above employs a resin body for the cooler in the lamination unit on which pressure is applied in the laminating direction. Since the resin body is easily formed into a complex shape, it is possible to obtain a highly strong body at low cost. By employing the resin body, strength of the cooler is ensured, and deformation due to application of pressure is restrained. However, thermal conductivity of resin is lower than that of metal such as aluminum. Therefore, in the cooler of the lamination unit in this specification, the metal plate is used for a member that transfers heat of the power card. To be specific, in a surface of the resin body, which faces the power card, the opening is provided, and the metal plate is arranged so as to close the opening. One of the surfaces of the metal plate faces the power card. Because of the metal plate, heat of the power card is efficiently transferred to refrigerant inside the body. Inside of the body serves as a flow passage where the refrigerant flows. Therefore, the refrigerant comes into direct contact with a back surface of the metal plate. Hence, it is also possible to ensure high cooling performance.

In the power converter described in this specification, a gap between the metal plate and the opening is sealed by using pressure that the lamination unit receives in the laminating direction of the lamination unit. A gasket is fitted into a gap between the metal plate and a body side surface around the opening, and the gap between the opening and the metal plate is sealed as the above-mentioned pressure compresses the gasket. With the foregoing structure, it is possible to simplify a sealing structure for the opening. In the aforementioned power convertor, the cooler has high strength, and, in addition, the power card has good cooling efficiency.

A method for manufacturing a power converter described in this specification has the following structure. The power converter has a lamination unit where a plurality of power cards and a plurality of coolers are laminated. The cooler includes a body and a metal plate. The body has an opening on a side surface facing the adjacent power card. The body is made of resin. The manufacturing method includes: fixing the metal plate to each of the power cards; laminating, after the fixing, the power card and the body such that the metal plate covers the opening and forming the lamination unit; and housing the lamination unit in a case while applying pressure on the lamination unit in a laminating direction.

According to this manufacturing method, it is possible to position the power card and the metal plate to the body of the cooler at the same time.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 6 is an enlarged view of a range shown by a broken line VI in FIG. 5;

FIG. 12B is a sectional view taken along the line BB in FIG. 8.

DETAILED DESCRIPTION OF EMBODIMENTS

Figure 1:
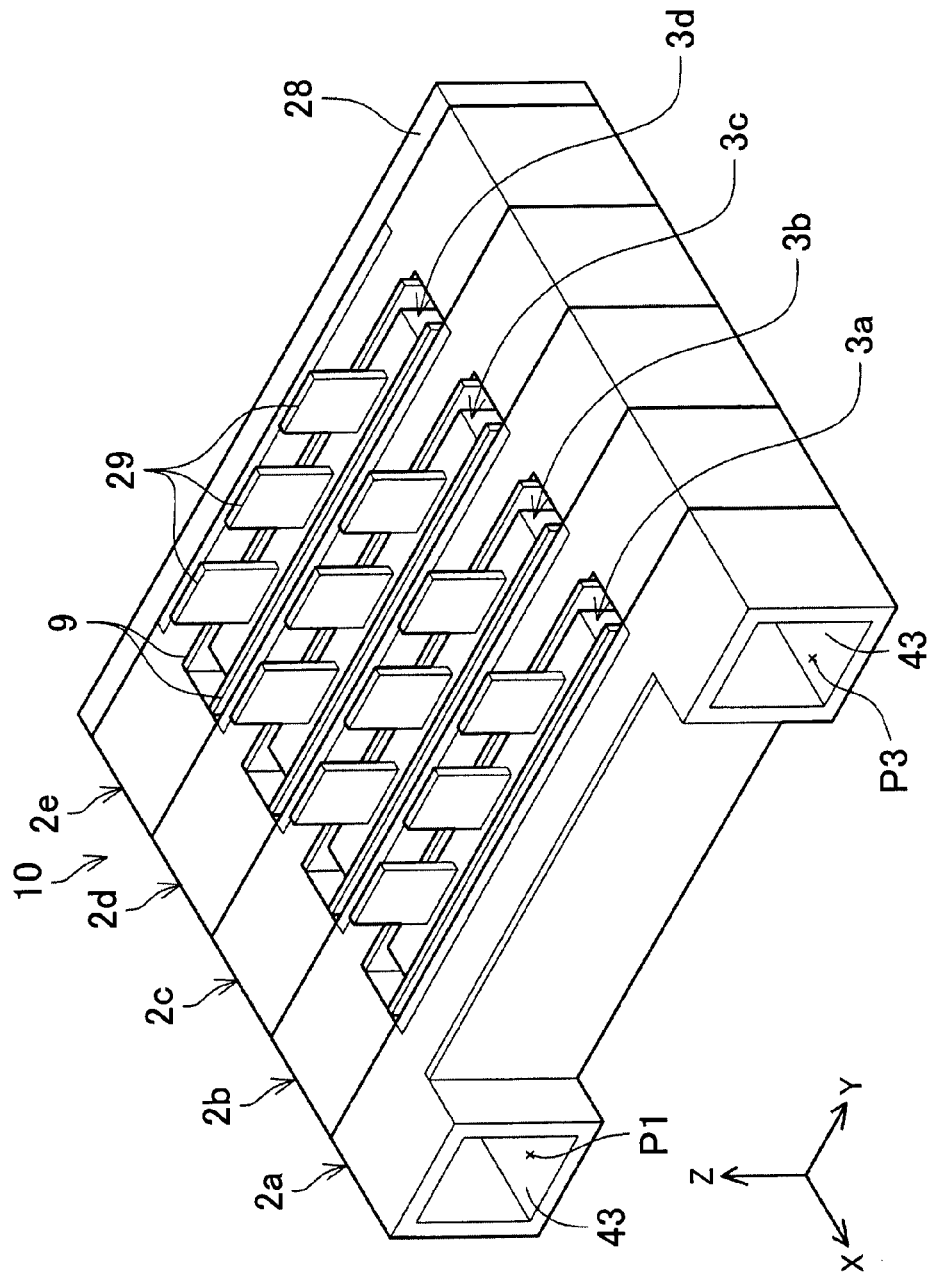
FIG. 1 is a perspective view of a lamination unit of a power converter according to a first example.

A power converter according an example is explained with reference to the drawings. First of all, an outline of a lamination unit is provided. FIG. 1 shows a perspective view of a lamination unit 10. The lamination unit 10 is a main component of a power converter mounted on an electric vehicle. The power converter boosts direct-current power of a battery, further converts the direct-current power into an alternating current, and supplies the power to a motor for running. The power converter includes a voltage converter circuit that increases voltage, and an inverter circuit. The voltage converter circuit is a step-up/step-down converter and includes two semiconductor elements (IGBTs). The inverter circuit includes six semiconductor elements. The power converter includes eight semiconductor elements in total. Each of the semiconductor elements generates a large amount of heat because the semiconductor element conducts and brakes large current. The number of the semiconductor elements may be different depending on a vehicle type (a type of the power converter).

The lamination unit 10 is a unit that aggregates the above-mentioned eight semiconductor elements in one location and cools the semiconductor elements intensively. The lamination unit 10 is a unit in which four power cards 3a, 3b, 3c, 3d and five coolers 2a, 2b, 2c, 2d, 2e are laminated alternately. An X-axis direction in the drawings corresponds to a laminating direction. The plurality of coolers 2a to 2e has the same structure. Similarly, the plurality of power cards 3a to 3d has the same structure. Herein below, in the case where any one of the plurality of coolers 2a to 2e is expressed without making distinctions, the cooler is stated as a "cooler 2". Similarly, in the case where any one of the plurality of power cards 3a to 3d is expressed without making distinctions, the power card is stated as a "power card 3".

Figure 11A:
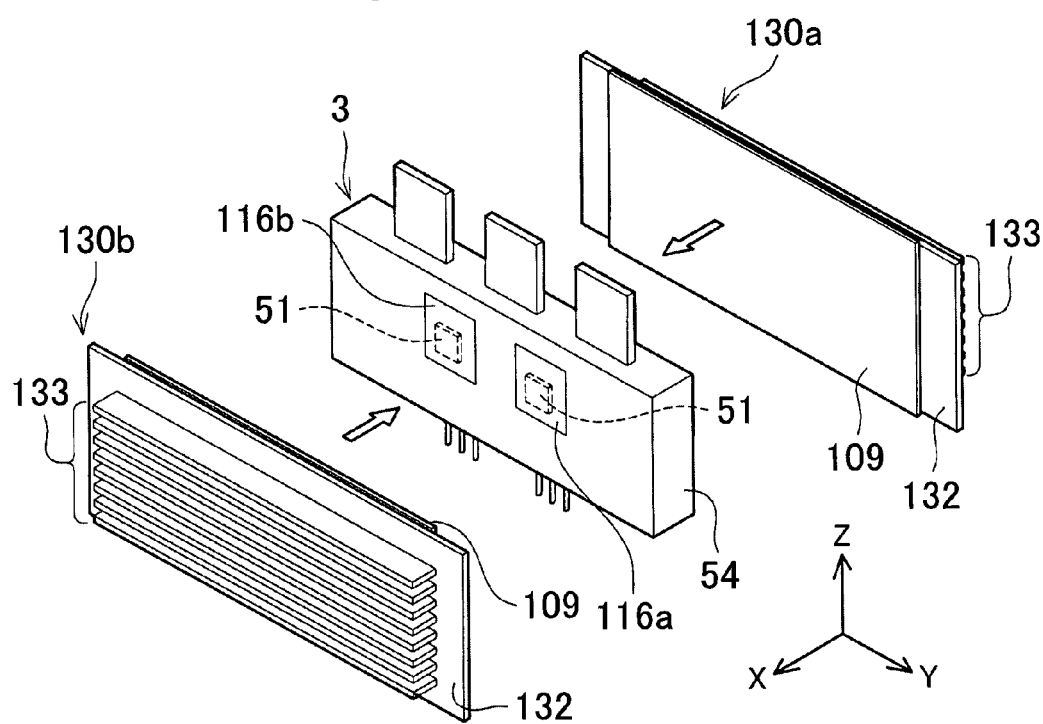
FIG. 11A is an exploded perspective view of a power card sub-assembly.

Each of the power cards 3 is a package in which two semiconductor elements are molded using resin. The two semiconductor elements are connected in series inside each of the power cards 3. Three terminals 29 extend from each of the power cards 3. The three terminals 29 correspond to a high-potential side terminal, and a low-potential side terminal of a series circuit of the semiconductor elements, and a terminal in a middle point of the series circuit, respectively. In addition to the three terminals 29, terminals (gate terminals) connected to gates of the semiconductor elements (IGBTs) extend from the power card 3 on a side surface on the opposite side of a side surface where the terminals 29 extend. The gate terminals are shown in FIG. 11A and so on.

Liquid refrigerant passes inside the cooler 2 that sandwiches the power card 3. The refrigerant is, for example, water or LLC (long life coolant). Each of the coolers 2 has through holes 43 on both sides of the power card 3 in a Y-axis direction. As the coolers 2 are laminated, the through holes 43 of the neighboring coolers 2 are connected with each other. The connected through holes 43 structure a supply passage P1, which supplies the refrigerant to a flow passage P2 inside a body of the cooler 2, and a discharge passage P3, which discharges the refrigerant that has passed through the flow passage P2. A cover 28 is provided in one end of the lamination unit 10 and closes the through holes of the cooler 2e.

Figure 2:
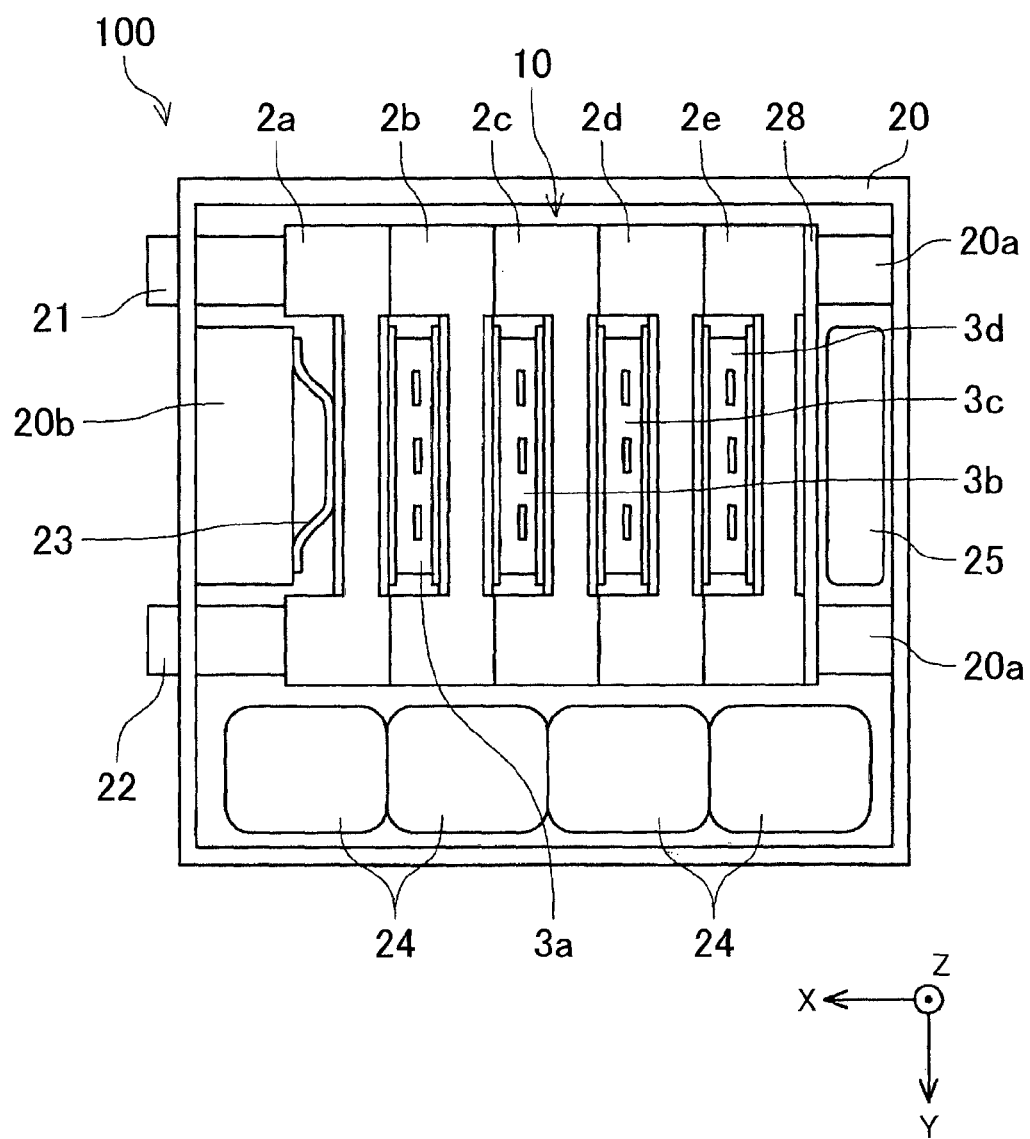
FIG. 2 is a plan view showing a layout inside a case of the power converter according to the first example.

A device layout inside a case of a power converter 100 including the lamination unit 10 is explained. FIG. 2 is a plan view of the power converter 100. In a case 20, a plurality of capacitor elements 24 and a reactor 25 are housed in addition to the lamination unit 10. Some of the capacitor elements 24 are connected to a low-voltage side of the voltage converter circuit and structures a filter capacitor. The rest of the capacitor elements 24 are connected to a high-voltage side of the voltage converter circuit and structures a smoothing capacitor. Since the power converter 100 deals with large current to be supplied to a motor for running, the capacitor element 24 has a large structure. The reactor 25 is used in a chopper voltage converter circuit.

The lamination unit 10 is arranged between supporting walls 20a and 20b provided in the case 20, and pressurized in the laminating direction by a leaf spring 23 that is fitted between one end of the lamination unit 10 and the supporting wall 20b. A supply pipe 21, which supplies the refrigerant from outside of the case into the lamination unit 10, and a discharge pipe 22, which discharges the refrigerant from the lamination unit 10, are connected to one end of the lamination unit 10. The supply pipe 21 and the discharge pipe 22 are communicated with the foregoing supply passage P1 and the discharge passage P3, respectively.

In addition to the devices stated above, a control board, which generates a PWM signal to be supplied to the semiconductor element in the power card 3, is also mounted in the case 20. However, the control board but is not shown.

Figure 3:
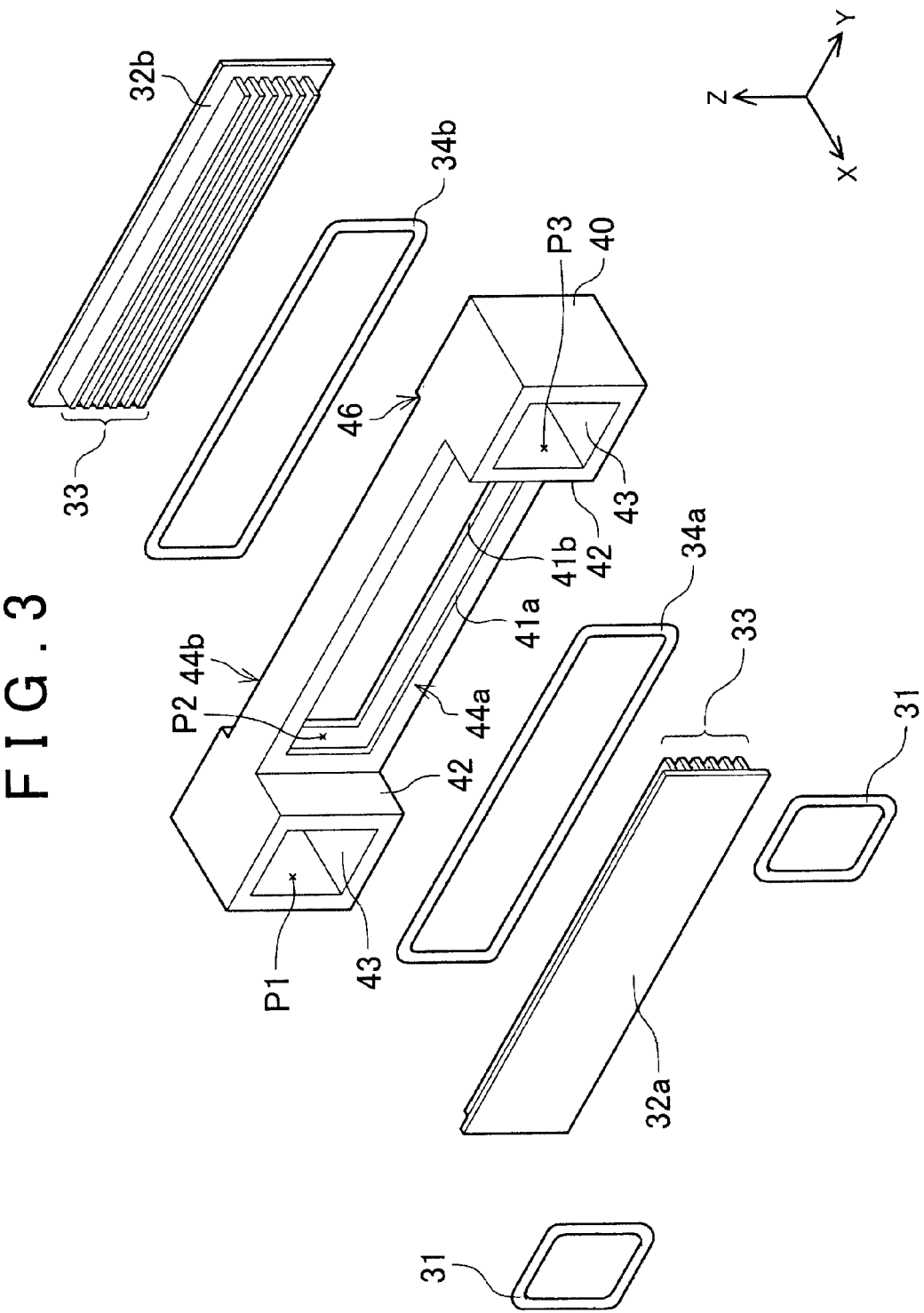
FIG. 3 is an exploded perspective view of a cooler.

Next, a structure of the cooler 2 is explained. FIG. 3 is an exploded perspective view of the cooler 2. A body 40 of the cooler 2 is made from resin. Although having a complex shape as shown in FIG. 3, since the body 40 is made from resin, the body 40 is manufactured highly accurately at low cost by, for example, injection molding. Inside of the body 40 works as the flow passage P2 in which the refrigerant passes. An opening 41a is provided in the center of the body 40 when viewed from the laminating direction (the X direction in the drawing). The opening 41a is provided at a position facing the power card 3. The opening 41a is closed by a metal plate 32a. To be in more detail, the metal plate 32a abuts on a body side surface 44a around the opening 41a through a silicone rubber gasket 34a, and closes the opening 41a. Projecting portions 42 are provided in both ends of the body 40 in the Y direction, and the projecting portions 42 project on one side (an X positive direction) in the laminating direction. The metal plate 32a is closely adhered to the body side surface 44a between the pair of projecting portions 42. An opening 41b is provided on the other side (an X negative direction) of the body 40 in the laminating direction. The opening 41b is also provided at a position facing a different power card 3. The opening 41b is closed by a metal plate 32b. To be in more detail, the metal plate 32b abuts on a body side surface 44b around the opening 41b through a silicone rubber gasket 34b and closes the opening 41b. Depressions 46 are provided on a side surface of the body 40 in the X negative direction, in other words, on the side surface where the opening 41b is provided, and the metal plate 32b is fitted into the depressions 46.

The power card 3 abuts on an outer side of the metal plate 32a. Another power card 3 abuts on an outer side of the metal plate 32b. The plurality of coolers 2 and the plurality of power cards 3 are alternately laminated one by one, and the body 40 of the cooler 2, the metal plate 32a (32b), and the power card 3 are closely adhered to each other. As stated earlier, pressure is applied onto the lamination unit 10 in the laminating direction of the lamination unit 10. Due to the pressure, the gasket 34a (34b) between the metal plate 32a (32b) and the body 40 is deformed, thereby sealing the opening 41a (41b).

A plurality of fins 33 is provided on a back surface of the metal plate 32a (32b) (a side facing inside of the body 40). The back surface of the metal plate 32a (32b) faces inside of the body 40, and comes into direct contact with the refrigerant flowing in the flow passage P2 inside the body. Therefore, heat of the power card 3 is dissipated into the refrigerant mainly through the metal plate 32a (32b) and the fins 33 on the back surface of the metal plate 32a (32b).

The projecting portions 42, which project in the laminating direction, are provided in the body 40 on both sides of the opening 41a in the Y-axis direction when viewed from the laminating direction (the X-axis direction in the drawing). Through holes 43 are formed on inner sides of the projecting portions 42, passing through in the laminating direction. As stated earlier, in the lamination unit 10, the projecting portions 42 are joined to the body 40 of the neighboring cooler, and the through holes 43 are connected with each other, thus forming the supply passage P1 and the discharge passage P3. The passages P1, P3 are communicated with the flow passage P2 inside the body. The refrigerant is distributed to all of the coolers through the aforementioned supply pipe 21 and the supply passage P1. The refrigerant absorbs heat of the power card 3 through the metal plate 32a (32b) and the fins 33 while flowing through the flow passage P2. The refrigerant that has absorbed heat is discharged outside of the case through the discharge passage P3 and the discharge pipe 22.

As described earlier, the body of the cooler 2 is made from resin. As shown in FIG. 3, the projecting portion 42 of the body 40 has a larger thickness in the laminating direction compared to a portion where the opening 41a is provided. Therefore, projecting portions 42 are able to maintain high strength with respect to the laminating direction, and are able to reduce a deformation amount against pressure. Another gaskets 31 are abutted on edge surfaces of the projecting portions 42, thereby sealing gaps between the projecting portions 42 and the body 40 of the neighboring cooler. Thicknesses of the gaskets 34a, 31 are selected so that sealing of a gap between the body 40 and the metal plate 32a by the gasket 34a, and sealing of gaps between the projecting portions 42 and the neighboring body 40 by the gaskets 31, are achieved at the same time. For example, the thickness of the gasket 31 is set to be larger than the thickness of the gasket 34a. Then, it is possible to ensure sealing by the gaskets 31, after sealing by the gasket 34a is ensured.

Figure 4:
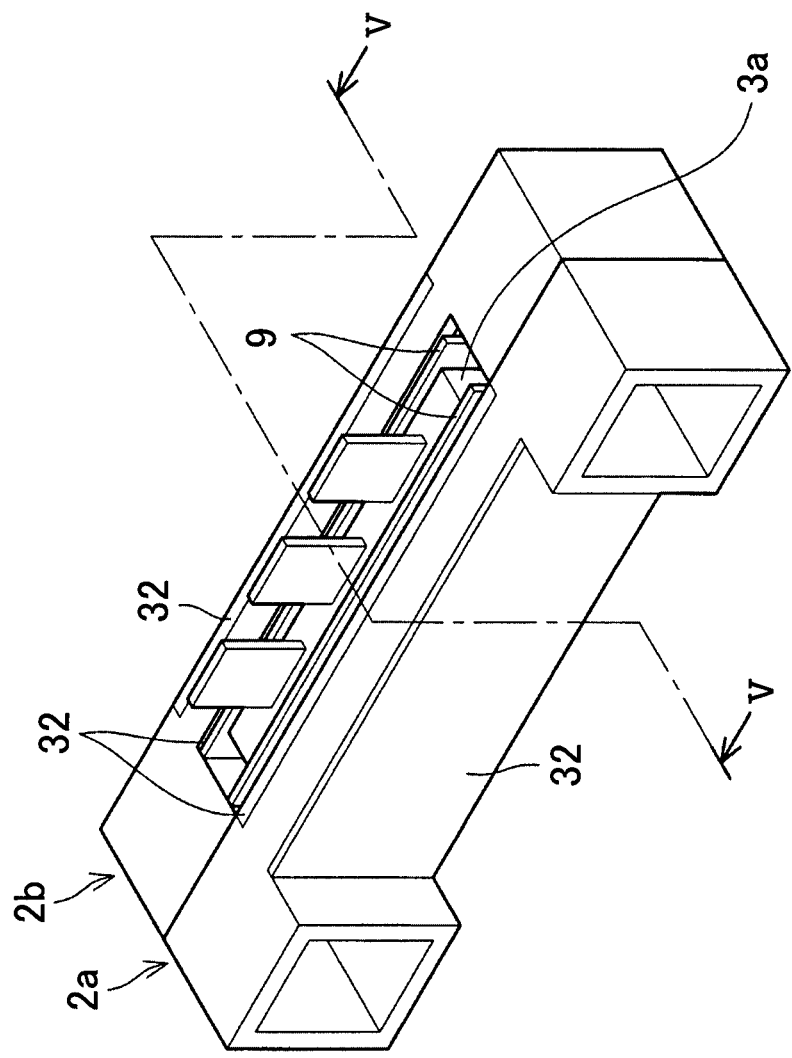
FIG. 4 is a perspective view of a set of coolers and a power card sandwiched between the coolers.
Figure 5:
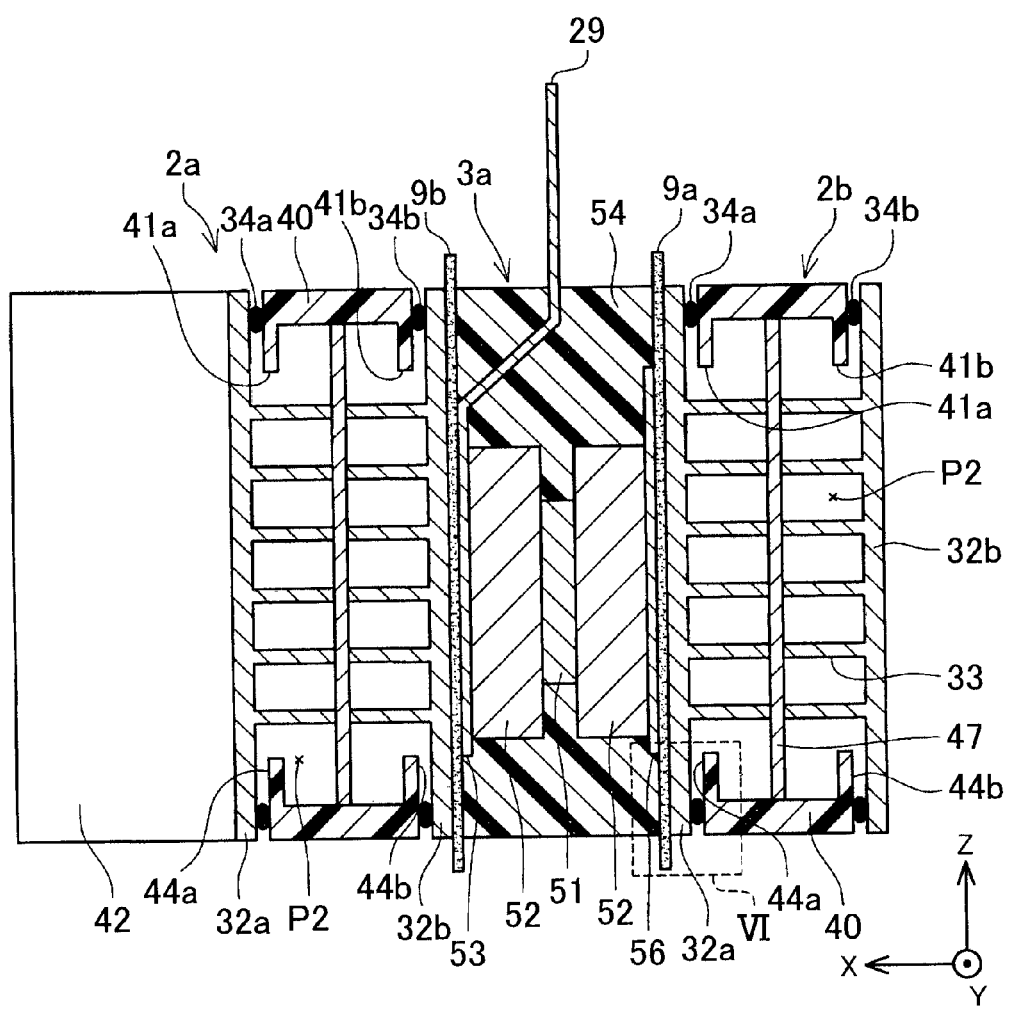
FIG. 5 is a sectional view taken along the line V-V in FIG. 4.

FIG. 4 shows a perspective view of the two coolers 2a, 2b and the power card 3a sandwiched between the coolers 2a, 2b. FIG. 5 shows a sectional view taken along the line V-V in FIG. 4. Explanation is provided with regard to an inner structure of the power card 3 with reference to FIG. 4 and FIG. 5, and supplementary explanation is also given regarding an inner structure of the cooler 2. FIG. 4 only shows the two coolers 2a, 2b and one power card 3a. It should be noted that, as shown in FIG. 1, another power card and another cooler are laminated on the other side of the power card 3a of the cooler 2a, and, further, another power card and another cooler are also laminated on the other side of the cooler 2b. In FIG. 4, all of the metal plates have the same reference numeral 32. Herein after, in the case where any one of the plurality of metal plates is expressed, the metal plate is referred to as the metal plate 32. With regard to insulating plates 9a, 9b described later, in the case where any one of the insulating plates 9a, 9b is expressed, the insulating plate is referred to as an insulating plate 9.

The inner structure of the power card 3a is explained. The power card 3a is a device in which two semiconductor elements 51 are sealed by a resin package 54. Although there is only one semiconductor element shown in FIG. 5, the other one is located on a back side of the semiconductor element 51 from the sheet surface. The two semiconductor elements 51 are IGBTs. The two semiconductor elements 51 are connected in series inside the resin package 54. The semiconductor element 51 is a small flat plate chip, and an emitter electrode is exposed on one of both flat surfaces of the semiconductor element 51, and a collector electrode is exposed on the other surface. A gate electrode is not shown. Conductive spacers 52 are brought into contact with the electrodes on both surfaces of the semiconductor element 51, and heat sinks 53, 56 are brought into contact with the other side of the spacers 52. One of the surfaces of the heat sinks 53, 56 is exposed from the resin package 54. The heat sinks 53, 56 also serve as terminals, and the heat sinks 56 connect the two semiconductor elements 51 in series. The two heat sinks 53 are arranged in a perpendicular direction to the sheet surface in FIG. 5. One of the heat sinks 53 also serves as a high-potential side terminal of the series connection, and the other also serves as a low-potential side terminal. FIG. 5 shows well that the heat sink 53 continues from the terminal 29 that extends upwardly from the resin package 54. Since the heat sinks 53, 56 are electrically continuous with the electrodes of the semiconductor element 51, the insulating plate 9a is provided on one side of the power card 3a for ensuring insulation between the heat sink 53 and the metal plate 32a of the cooler 2. Similarly, the insulating plate 9b is provided on the other side of the power card 3a for ensuring insulation between the heat sink 56 and the metal plate 32b of the cooler 2. For a material for the insulating plate 9, ceramic having high thermal conductivity is used. Grease is applied between the insulating plate 9 and the power card 3, and between the insulating plate 9 and the metal plate 32. Layers of the grease are formed thinly and uniformly by pressure applied to the lamination unit 10 in the laminating direction.

Next, supplementary explanation is given regarding the structure of the coolers 2a, 2b that face the power card 3a through the insulating plates 9. The openings 41a are provided in the side surfaces 44a on one side of the bodies 40 in the laminating direction. The openings 41b are provided on the other side surfaces 44b. Each of the openings 41a is sealed by the metal plate 32a through the gasket 34a. Although the section of the gasket 34a is expressed as an ellipse in FIG. 5, the details of the shape of the gasket 34a is described later. The fins 33 extend on the back surface of the metal plate 32a. The opening 41b is provided on the other side surface 44b of the body 40. The opening 41b is sealed by the metal plate 32b through the gasket 34b. The gaskets 34a and 34b are the same. The metal plates 32a, 32b are provided at outer sides of the openings 41a, 41b on both sides of the body 40, respectively. Distal ends of the fins 33 of each of the metal plates 32a, 32b face each other inside the body. A partition plate 47 may be provided in order to fill a clearance between the distal ends of the pair of fins. The partition plate 47 contributes to a smooth flow of the refrigerant by defining the flow passage P2 inside the body 40. Further, the partition plate 47 reduces deflection of the metal plates 32a, 32b caused by pressure in the laminating direction. The partition plate 47 may be made from resin or metal. In the case where the partition plate 47 is made from resin, it is possible to form the partition plate 47 integrally with the body 40. In FIG. 3, the partition plate 47 is not shown.

The gasket 34a is explained. FIG. 6 shows an enlarged view of a range of a broken line denoted by reference character VI in FIG. S. The gasket 34a is fitted into a gap between the body side surface 44a around the opening 41a, and the metal plate 32a. The gasket 34a is made of silicone rubber that is flexible and has high heat resistance. As well shown in FIG. 6, the gasket 34a has two projections on a metal plate side (left side in the drawing) and on a body side (right side in the drawing), respectively, from a body 35a of the gasket 34a. A section of the gasket 34a is uniform, and the projections circle around the opening 41a and form protrusions 35. In short, the gasket 34a has four ring-like protrusions 35b that doubly surround the opening 41a. By having the ring-like protrusions 35b that circle around the opening 41a in a multiple fashion, each of the protrusions is squeezed well against pressure in the laminating direction, thus making sure even more that the gap between the metal plate 32a and the opening 41a is sealed. The protrusions 35b are sometimes referred to as lips. It should be noted that the sectional shapes of the gaskets in FIG. 3 and FIG. 5 are simplified. Similar gasket 34b is also sandwiched between the body side surface 44b and the metal plate 32b on the other side.

Notes regarding the techniques described in the first example are given. In the cooler according to the example, the side surface 44a around the opening 41a (see FIG. 3) is flat, and the gasket 34a is arranged on the flat surface (see FIG. 6). However, a structure may be employed, in which a groove that circles around the opening 41a is provided on the body side surface 44a, and the gasket 34a is housed in the groove. In this case, a part of the gasket 34a is exposed from the groove, so that the exposed portion comes into contact with the metal plate 32a and seals the opening 41a. On the contrary, a groove may be provided in the metal plate 32a, in which a part of the gasket is buried. The same applies to the opening 41b on the other side, and the side surface 44b around the opening 41b. The other coolers 102a, 102d, 102e have the same structure as 102b, 102c. Because of such a structure, it is possible to fix the gasket 34 at a given position easily, which contributes to a reduction in assembly man-hours of the cooler.

The plurality of fins 33 is provided on the back surface (on the inner side of the body) of the metal plate 32. The metal plate 32 and the fins 33 are both made from aluminum. The fins 33 are a part of the metal plate 32, and the fins 33 and the metal plate 32 are fabricated at the same time by extrusion molding. The fins 33 may also be fabricated separately from the metal plate 32, and attached to the metal plate 32 later.

The metal plate 32 and the insulating plate 9 may be adhered to the power card 3 in advance. As stated earlier, sealing of the opening 41a (41b) by the metal plate 32a (32b) is achieved by application of pressure on the lamination unit 10. Therefore, the metal plate 32 does not need to be fixed to the body 40 of the cooler 2. Hence, by adhering the metal plate 32 and the insulating plate 9 to the power card 3 in advance, it becomes possible to simplify steps of assembly of the lamination unit 10 and insertion into the case 20.

As described earlier, the heat sinks 53, 56 exposed on the side surface of the power card 3 are conductive with the semiconductor elements 51 inside. The insulating plate 9 insulates between the heat sink 53 (56) and the metal plate 32.

Therefore, the insulating plate 9 is one of components of the power card 3. Instead of the insulating plate 9, an insulating film that covers the heat sink 53 (56) may be provided on a surface of the power card 3. The expression that "the power card 3 and the cooler 2 are laminated" includes both cases where the insulating plate is sandwiched and is not sandwiched between the power card 3 and the cooler 2.

The though hole in the projecting portion 42 according to the first example corresponds to an example of a communicating hole that is communicated with a space inside the body. The projecting portion 42 having the through hole 43 may also be referred to as a "cylindrical portion 42".

(Second example) Next, a power converter 100b according to a second example is explained by using FIG. 7 to FIG. 12B. A power card 3 is the same as the power card 3 in the first example, and the explanation is thus omitted. In the second example, a method for manufacturing a power converter is also explained.

Figure 7:
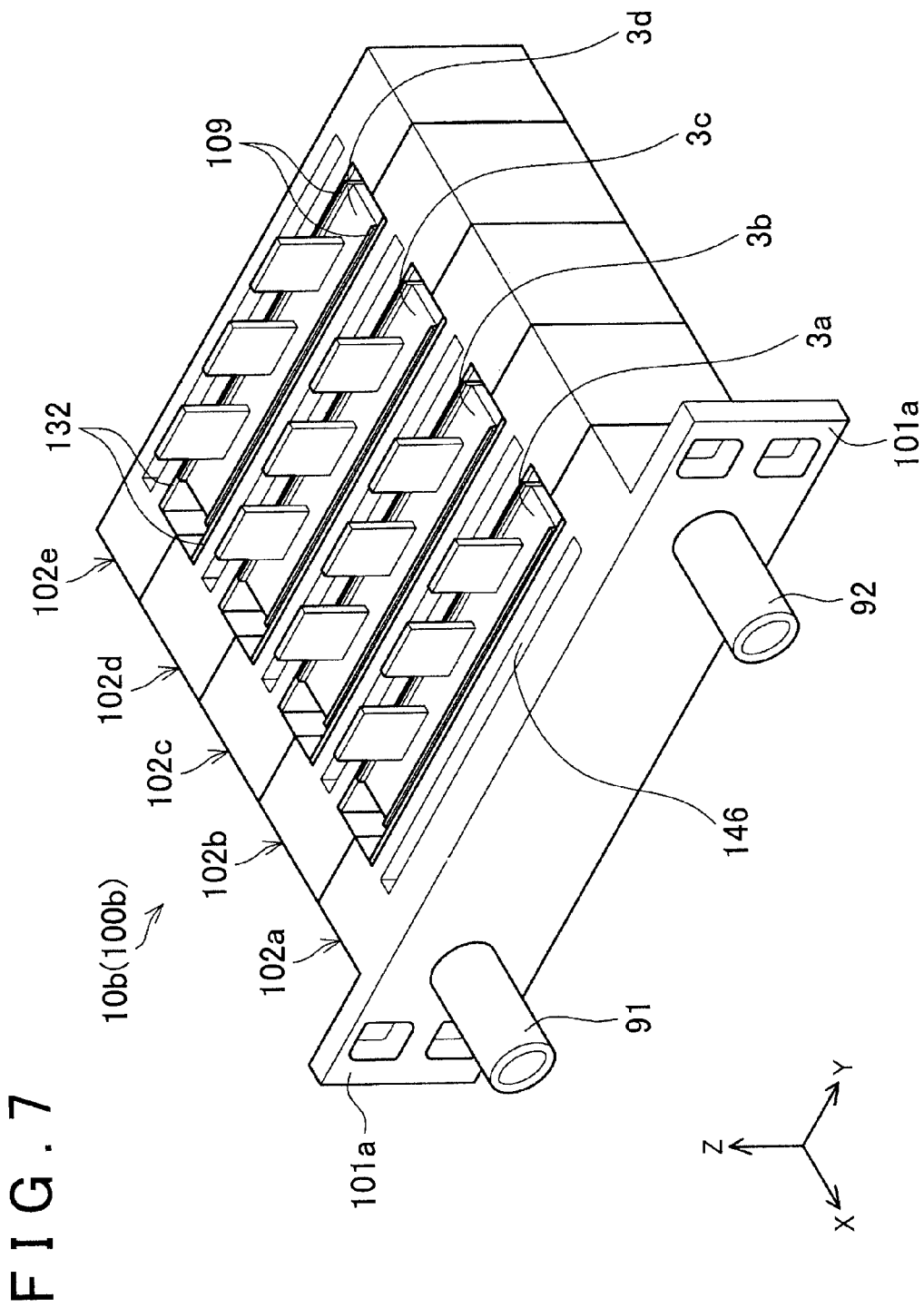
FIG. 7 is a perspective view of a lamination unit in a power converter according to a second example.

FIG. 7 is a perspective view of a lamination unit 10b of the power converter 100b according to the second example. In the lamination unit 10b, four power cards 3a to 3d, and five coolers 102a to 102e are laminated. Each of the power cards and each of the coolers are a flat plate-type, and are laminated so that a flat surface of the power card and a flat surface of the cooler face each other. The coolers 102a and 102e on both ends in a laminating direction (an X-axis direction in the drawings) have slightly different shapes from the other coolers 102b to 102d, but are basically the same as the other coolers 102b to 102d. The power cards 3a to 3d and the coolers 102a to 102e are alternately laminated one by one, and the cooler faces each of the surfaces of the power card. Herein below, in the case where any one of the power cards 3a to 3d is expressed, the power card is referred to as a power card 3. Although details are given later, openings are provided in surfaces of each of the coolers 102 to 102e, which face each of the power cards 3, and each of the openings is sealed by a metal plate 132. An insulating sheet 109 is sandwiched between the metal plate 132 and the power card 3. The insulating sheet 109 is a part of the power card 3.

A refrigerant supply pipe 91 and a refrigerant discharge pipe 92 are attached to the cooler 102a. The refrigerant supply pipe 91 corresponds to the supply pipe 21 of the first example, and the refrigerant discharge pipe 92 corresponds to the discharge pipe 22 of the first example (see FIG. 2). The coolers, which are adjacent to each other through the power card, are communicated with each other, and refrigerant is supplied to each of the coolers 102a to 102e through the refrigerant supply pipe 91. The refrigerant passes inside a body of each of the coolers 102a to 102e. The refrigerant that has absorbed heat of the power card is discharged outside through the refrigerant discharge pipe 92. The refrigerant is liquid, and may typically be water.

Flanges 101a to be fixed to a case are provided on both sides of the cooler 102a. An opening in the surface of the cooler 102e at the outer side in the laminating direction is closed in advance. Although not shown, like the first example, the lamination unit 10b is also fixed to the case, and pressure is applied to the lamination unit 10b by the case and a leaf spring in the laminating direction. The leaf spring is arranged at the outer side of the cooler 102e. A weight-reducing groove 146 is also provided on a top surface of each of the coolers 102a to 102e.

Figure 8:
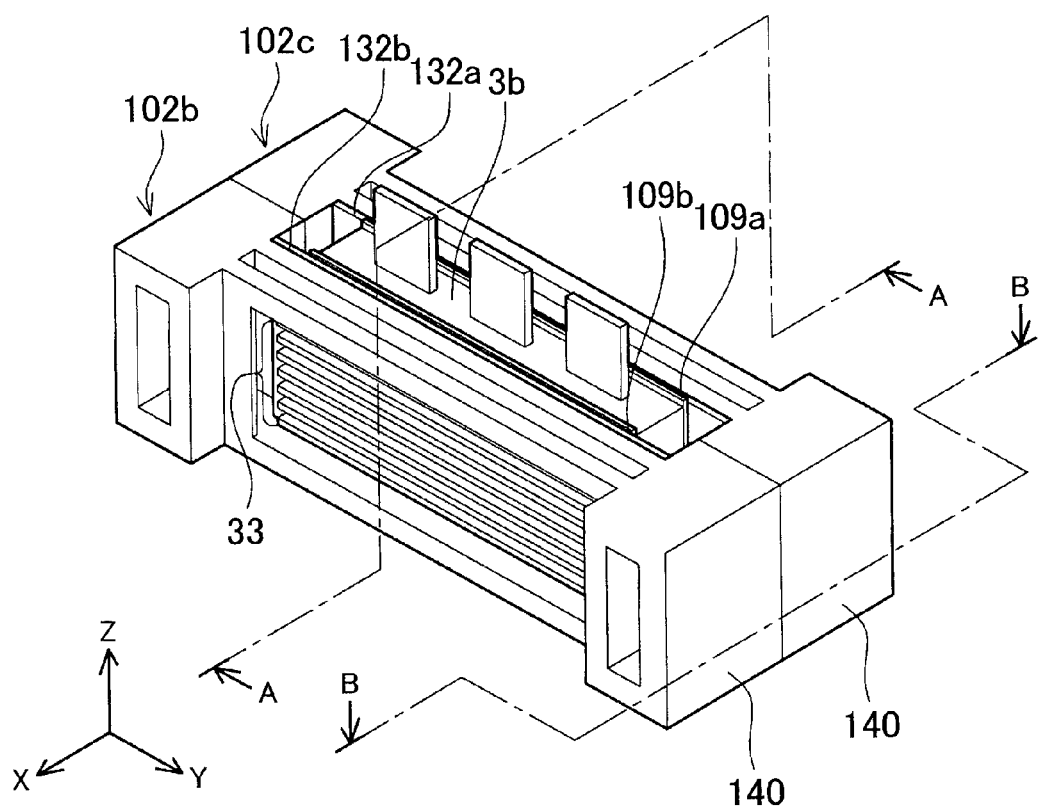
FIG. 8 is a perspective view of a set of coolers and a power card sandwiched between the coolers.
Figure 9:
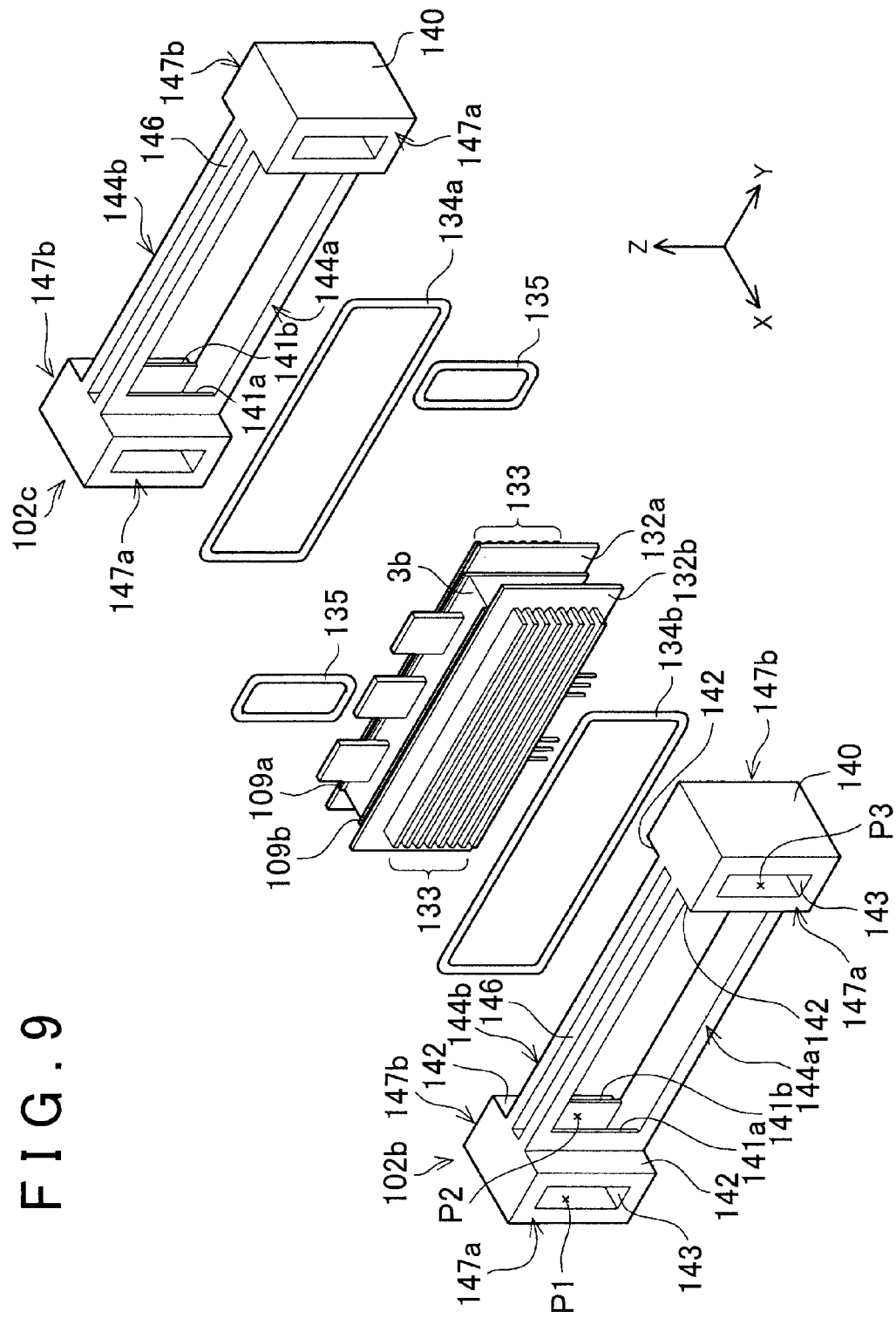
FIG. 9 is an exploded perspective view of a sub-assembly shown in FIG. 8.

FIG. 8 shows a perspective view of a pair of coolers 102b, 102c, and a power card 3b sandwiched between the coolers 102b, 102c. It should be noted that another power card and another cooler are connected to the cooler 102b on the opposite side of the power card 3b, and another power card and another cooler are also connected on the other side of the cooler 102c. FIG. 9 shows an exploded view of the structure shown in FIG. 8. The coolers 102b and 102c have the same structure. The same reference numerals are used for the same components of the cooler 102b and the cooler 102c. Herein below, explanation is given with reference to mainly the cooler 102b in FIG. 9. Therefore, in the explanation below, refer to the cooler 102b in FIG. 9 for the components with reference numerals unless the coolers 102b and 102c are distinguished Like the cooler 2 according to the first example, the cooler 102b is made from a resin body 140 having openings 141a, 141b, and metal plates 132a, 132b that close the openings. In FIG. 8 and FIG. 9, a metal plate that closes the opening 141a of the cooler 102b, and a metal plate that closes the opening 141b of the cooler 102c are not shown. The metal plate that closes the opening 141a of the cooler 102b is similar to the metal plate 132a that closes the opening 141a of the cooler 102c. The metal plate that closes the opening 141b of the cooler 102c is the same as the metal plate 132b that closes the opening 141b of the cooler 102b. Although details are provided later, the metal plates 132a, 132b are attached to the power card 3b as shown in FIG. 9. Similarly, the metal plates 132a, 132b are attached to both surfaces of each of the other power cards 3a, 3c, 3d.

The structure of the cooler 102b is explained in detail. In the resin body 140, the opening 141b is provided in a side surface 144b that faces the power card 3b. The opening 141a is provided in a side surface 144a that faces the power card 3a (not shown in FIG. 9, FIG. 10A and FIG. 10B). For the structure of the opening 141a and the surrounding of the opening 141a, refer to the structure of the opening 141a of the coolers 102c shown in FIG. 9, and the surrounding of the opening 141a.

The opening 141a is sealed by the metal plate 132a through a gasket 134a. The opening 141b is sealed by the metal plate 132b through a gasket 134b. As stated earlier, since pressure is applied to the lamination unit 10b in the laminating direction, the pressure establishes sealing of the opening 141a and the metal plate 132a and sealing of the opening 141b and the metal plate 132b. Therefore, metal plates 132a, 132b do not need to be fixed to the body 140. Although a groove for housing the gasket 134a (134b) is provided in the side surface 144a (144b) of the body 140, the groove is not shown in FIG. 9. The groove that houses the gasket 134a (134b) is described later.

In the case where the metal plates 132a and 132b are dealt with without making distinctions, the metal plates are referred to as metal plates 132. Similarly, in the case where the insulating sheets 109a and 109b are dealt with without making distinctions, the insulating sheets are referred to as insulating sheets 109. In one of surfaces of the metal plate 132 (a surface facing the body 140), fins 133 are provided, and the other surface faces the power card 3b. The metal plate 132 is fixed to the power card 3b through the insulating sheet 109. A silicon-based heat radiating adhesive is used for fixing the metal plate 132 and the insulating sheet 109. A similar adhesive is used for fixing the insulating sheet 109 and the power card 3b. As the openings 141a, 141b on both sides of the body 140 are closed, inside of the body 140 forms a refrigerant flow passage P2. Since the fins 133 come into direct contact with the refrigerant in the flow passage P2, heat of the power card 3b is absorbed well by the refrigerant through the metal plate 132 and the fins 133.

Two projecting portions 142 are provided on side surfaces of the body 140 in the laminating direction, respectively. The two projecting portions 142 project in the laminating direction. The two projecting portions 142 are located on both sides of the power card 3b when viewed from the laminating direction (an X-axis direction). Through hole 143 is provided on inner sides of the projecting portion 142, passing through in the laminating direction. When the pair of coolers 102b, 102c are joined to each other through the power card 3b, the projecting portion 142 of the cooler 102b on one side, and the projecting portion 142 of the cooler 102c on the other side are connected with each other through another gaskets 135. The pressure applied in the laminating direction establishes sealing of two projecting portions 142, which are connected with each other. As the projecting portions 142 of the pair of neighboring coolers are connected with each other, the through holes 143 inside are communicated with each other. Inner spaces P2 of the neighboring coolers are communicated with each other through the two connected through holes 143. Although grooves that house the gaskets 135 are provided in edge surfaces 147a, 147b of the projecting portions 142, the grooves are not shown in FIG. 9. The grooves that house the gaskets 135 are described later. The projecting portion 142 having the through hole 143 may also be referred to as a "cylindrical portion 142". A weight-reducing groove 146 is provided in a top surface of the body 140 (a surface facing a Z-axis positive direction).

A method for manufacturing the power converter 10b is explained. FIG. 10A to FIG. 11B show an assembly process of a power card sub-assembly. Herein below, one of the coolers 102b to 102d in FIG. 7 is referred to as a cooler 102. As stated earlier, the metal plates 132a, 132b, which are components of the cooler 102, are fixed to the power card 3 before being assembled to the body 140 of the cooler 102. To be more specific, the metal plate 132a is fixed to one of the power cards 3 (for example, the power card 3b), and the metal plate 132b is fixed to another power card 3 (for example, the power card 3c). The metal plate 132b is fixed to the other side surface of the power card 3b, and the metal plate 132a is fixed to the other side surface of the power card 3c. In short, the metal plate 132a is fixed to one of side surfaces of the one of the power cards in the laminating direction (X-axis direction), and the metal plate 132b is fixed to the other side surface. The metal plates fixed to the side surfaces of one of the power cards serve as components for sealing the openings of different coolers.

First of all, the body 140 of the cooler 102 shown in FIG. 9 is prepared. The plurality of bodies 140, which is enough for the lamination unit, is prepared. It is possible to fabricate the bodies 140 at low cost by resin injection molding. Apart from the bodies 140, a plurality of power cards is prepared.

Figure 10A:
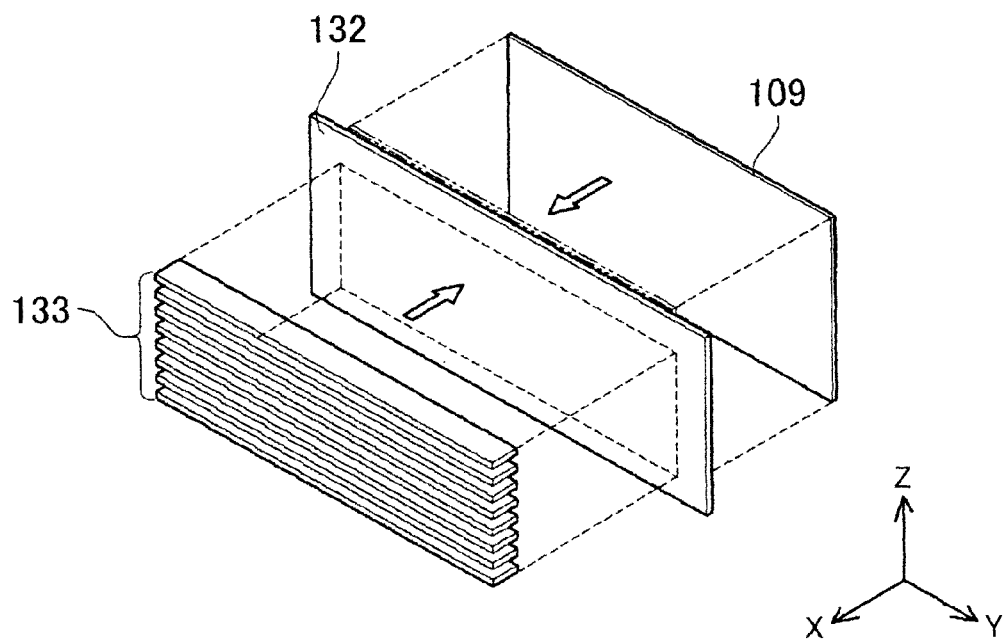
FIG. 10A is an exploded perspective view of a metal plate with fins.
Figure 10B:
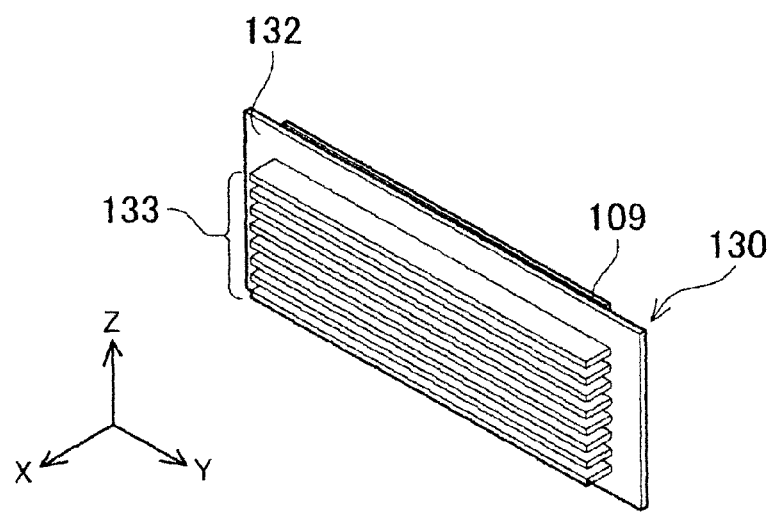
FIG. 10B is a perspective view of the metal plate with the fins.

Next, a sub-assembly of the power card 3 and the metal plates 132a, 132b is manufactured. As described before, in the case where the metal plates 132a, 132b are expressed without making distinctions, the metal plates are referred to as metal plates 132. When the insulating sheets 109a, 109b are expressed without making distinctions, the insulating sheets are expressed as the insulating sheets 109. First, the plurality of fins 133 is soldered to one of surfaces of the metal plate 132, and the insulating sheet 109 is adhered to the other surface (FIG. 10A). FIG. 10B is a view after the fins 133 and the insulating sheet 109 are attached to the metal plate 132. Herein below, the sub-assembly of the fins 133, the metal plate 132, and the insulating sheet 109 shown in FIG. 10B is sometimes referred to as a metal plate 130 with fins. Again, in the drawings, the fins 133 are depicted with an emphasis on the thickness in order to assist understanding. However, actual fins are very thin. Both of the metal plate 132 and the fins 133 are made from aluminum.

Figure 11B:
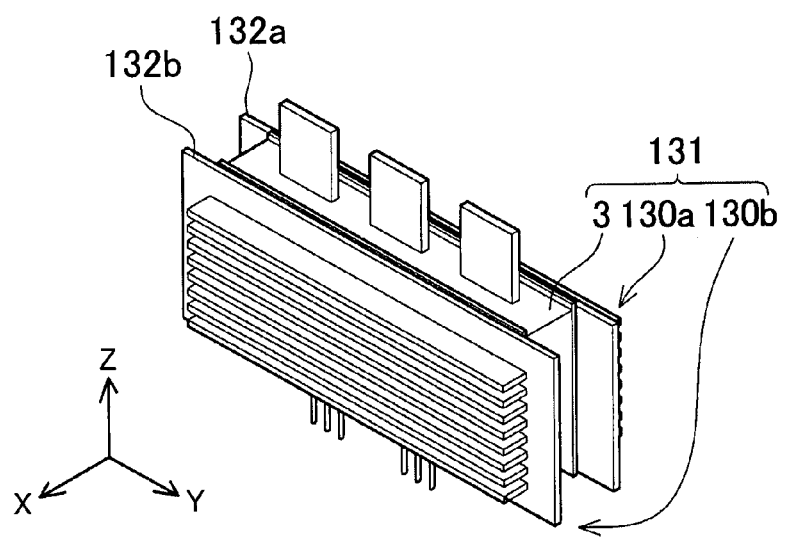
FIG. 11B is a perspective view of the power card sub-assembly.

Next, two metal plates with fins (the metal plate 130a, the metal plate 130b) are adhered to the side surfaces of the power card 3 in the laminating direction, respectively (FIG. 11A). Herein after, this step is sometimes referred to as a first step. Two semiconductor elements 51 are buried in the power card 3. A body 54 of the power card 3 is made from resin, and the two semiconductor elements 51 are sealed by the body 54. Heat sinks 116a, 116b are exposed on a surface of the body 54. The heat sinks 116a, 116b are in contact with the semiconductor elements 51 inside the body 54. The metal plate 130b with fins is attached to the power card 3 so as to face the heat sinks 116a, 116b. Another heat sinks are exposed on a back surface of the power card 3, and the metal plate 130a with fins is attached to the back surface. FIG. 11B shows a perspective view of the sub-assembly in which the metal plates 130a, 130b with fins are attached to the power card 3. The metal plate 132, which is a part of the cooler 102, is fixed to the power card 3 before the cooler is assembled. Herein after, the sub-assembly in FIG. 11B is sometimes referred to as a power card sub-assembly 131. Each of the four power cards 3a to 3d is assembled into the power card sub-assembly 131 in the same way.

Next, as shown in FIG. 7, the four power cards 3a to 3d (the four power card sub-assemblies 131) and the bodies 140 of the five coolers 102a to 102e are alternately laminated. In short, the power card, to which the metal plate 132a (132b) is fixed, is attached to the body so as to cover the opening 141a (141b) of the body 140 of the cooler. Herein below, this step is sometimes referred to as a second step. The second step is carried out after the first step. It should be noted that each cooler is completed when the plurality of power card sub-assemblies 131 and the plurality of bodies 140 of the coolers are alternately laminated one by one. The opening is not provided in one side surface of the cooler 102a located in one end of the lamination unit 10b. In the other side surface, the opening 141b is provided similarly to the cooler 102b, and the opening 141b is closed by the metal plate 132b. The metal plate 132b is fixed to a side surface of the power card 3a in advance. The opening is not provided in one side surface of the cooler 102e in the other end of the lamination unit 10b. In the other surface, the opening 141a is provided similarly to the cooler 102b, and the opening 141a is closed by the metal plate 132a. The metal plate 132a is fixed to a side surface of the power card 3d in advance.

As shown in FIG. 8 and FIG. 9, the metal plate 132 is fitted between the two projecting portions 142 of the body 140, and the position of the metal plate 132 is thus determined. The power card 3 is fixed to the metal plate 132 before the metal plate 132 is fitted to the body 140. Therefore, once the metal plate 132 is fitted to the body 140, a position of the power card 3 to the body 140 is determined subordinately. In short, in the manufacturing steps according to this example (the foregoing first step and the second step), the power card 3 and the cooler 102 are easily positioned.

Next, the lamination unit 10b is housed in a case together with a leaf spring. The case and the leaf spring are similar to those in FIG. 2 according to the first example. However, as stated earlier, the leaf spring is inserted between the cooler 102e and a wall surface of the case. The lamination unit 10b is held in the case while receiving pressure from the leaf spring in the laminating direction. Finally, the remaining components (the capacitor elements 24 and the reactor 25 in FIG. 2, and so on) are housed in the case, thereby completing the power converter 100b.

Figure 12A:
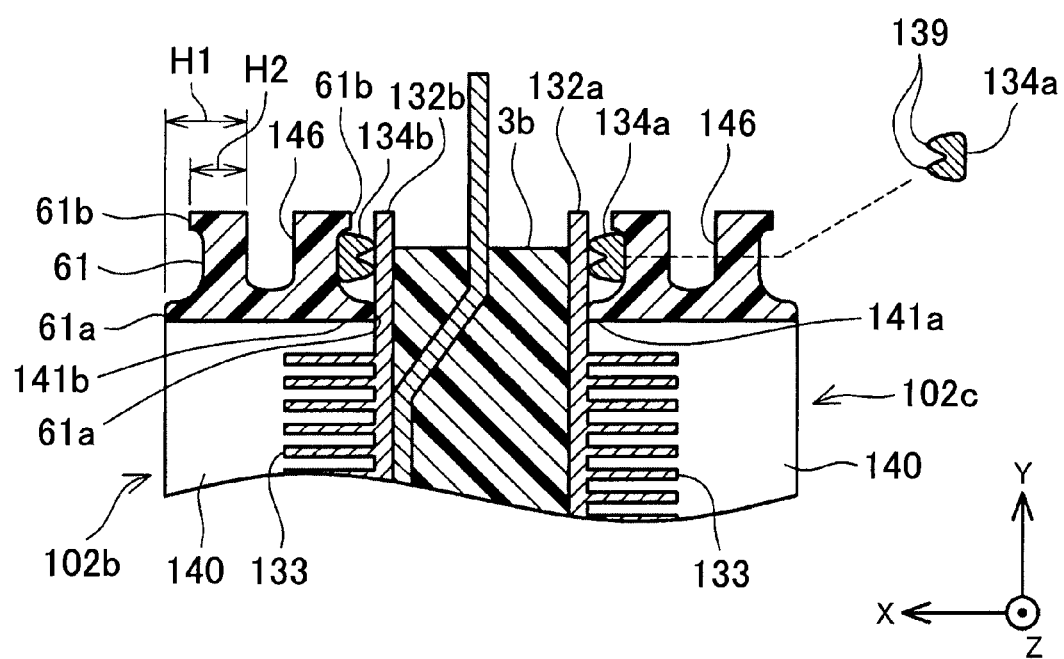
FIG. 12A is a sectional view taken along the line AA in FIG. 8.

The gaskets 134a (134b), 135 are explained. FIG. 12A is an enlarged sectional view taken along the line AA in FIG. 8. FIG. 12B is an enlarged sectional view taken along the line BB in FIG. 8. As shown in FIG. 12A and FIG. 12B, a groove 61 is provided in a side surface of the body facing the metal plate 132a (132b) so as to surround the opening 141a (141b). The gasket 134a (134b) is housed in the groove 61. The gasket 134a (134b) has two lips 139 (protrusions), and the two lips 139 surround the opening 141a (141b) doubly. The gasket 134a (134b) having the two lips 139 is sometimes referred to as a double-lip gasket To assist understanding, the gasket 134a is depicted alone in the upper right of FIG. 12A.

A groove 64 is provided in one of the edge surfaces 147a of the projecting portion 142 of the body 140, and a groove 63, having a different shape form the groove 64, is provided in the other edge surface 147b. The groove 63 and the groove 64 face each other, and the gasket 135 is housed between the groove 63 and the groove 64. As described earlier, the gasket 135 seals a gap between the pair of projecting portions 142 of the neighboring coolers. The gasket 135 is also a double-lip type.

One of the surfaces of the cooler 102b has three openings (the opening 141b and the two through holes 143). The three openings are sealed through one gasket 134b and two gaskets 135. In order to establish sealing of the three openings at the same time, the cooler 102b has the following structure. First, height of the gasket 134b is smaller than height of the gaskets 135. Height H1 of an edge 61a of the groove 61 on an opening side is larger than height H2 of an edge 61b at an outer side. Therefore, the edge 61a on the opening side abuts on the metal plate 132b. When the edge 61a on the opening side and the metal plate 132b abut on each other, the gasket 134b with small height is moderately compressed between the body 140 and the metal plate 132b, thereby establishing sealing between the opening 141b and the metal plate 132b. By abutting the metal plate 132b on the edge 61a on the opening side, relative positions of the body 140 and the metal plate 132b in the laminating direction are decided accurately.

At this time, a dimension of each part of the body is decided so as to ensure a clearance H5 between the projecting portion 142 of the cooler 102b and the adjacent projecting portion 142 of the cooler 102c. The gasket 135 is higher than the gasket 134b, and, when the clearance H5 is ensured, the gasket 135 is moderately compressed between the groove 63 and the groove 64, thus establishing sealing of the pair of projecting portions 142 (the through holes 143). The same applies to the opening 141a and the gasket 134a.

Notes are given regarding the techniques explained in the examples. As described in the second example, the metal plate 132, which seals the opening of the cooler, is fixed to the power card 3 before being attached to the body 140 of the cooler. A silicon-based heat-radiating adhesive is preferred for fixing the metal plate 132. The metal plate may be fixed to the power card by tinning, instead of adhesion. The metal plate, which is a component of the cooler, is fixed to the power card, and pressure is applied on the plurality of power cards and the plurality of coolers in the laminating direction. Hence, the metal plate does not necessarily have to be fixed to the body of the cooler. In other words, the metal plate is pressed against the opening of the body by pressure in the laminating direction, without being fixed to the body of the cooler.

The body 140 according to the second example is made of resin like the body 40 according to the first example. It is possible to fabricate a resin body having a complex shape at low cost by injection molding and so on. In particular, a body which has a thick side plate and good durability to pressure in the laminating direction is able to be fabricated at low cost. In short, the power converter according to the examples has the structure in which the plurality of coolers and the plurality of power cards are laminated, but is resistant to lamination. In addition, in the power converter according to the examples, the metal plate is arranged on the surface of the cooler, which faces the power card, and high cooling performance is thus ensured. Since resin is lighter than metal, the resin body is advantageous in terms of weight reduction.

The case may have a frame shape. The case of the power converter houses various devices in addition to the lamination unit. The case of the lamination unit may be a frame (an inner case) that is housed inside the case of the power converter. It is preferred that the gasket has a plurality of protrusions that surround the opening in a multiple fashion. Also, an insulating plate may be sandwiched between the metal plate and the power card. The insulating plate is a part of the power card.

The metal plate may be in direct contact with the power card, or an insulating plate may be sandwiched between the metal plate and the power card. In the second example, the insulating sheet is sandwiched between the metal plate of the cooler and the power card. The insulating sheet is a kind of the insulating plate. The insulating plate or the insulating sheet according to the examples corresponds to an example of an insulating member. The insulating sheet may also be regarded as a part of the power card. For example, in the case where the heat sink is exposed on a side surface of the power card, it is possible to ensure insulation by providing the insulating member. In the case where insulation is ensured between the heat sink on the side surface of the power card and the semiconductor element inside the power card, the insulating plate (the insulating sheet) is not necessary.

In inserting the power card after the cooler is completed, it is known that grease is applied between the cooler and the power card in order to improve heat transfer between the cooler and the power card. In the case of the power converter according to the second example, since the metal plate, which is a part of the cooler, is fixed to the power card in advance by an adhesive and so on, there is an advantage that grease is not required.

Characteristics of the power converter according to the examples can also be expressed differently as below. The power converter includes a lamination unit in which a plurality of power cards and a plurality of coolers are laminated, and a case that houses the lamination unit. In the lamination unit, the power cards, in which semiconductor elements are stored, and the coolers are alternately laminated. The case houses the lamination unit while applying pressure on the lamination unit on the laminating direction of the lamination unit. The cooler is provided with a resin body and a metal plate. The body is hollow inside, and an opening is provided in a side surface that faces the power card. The metal plate abuts on a body side surface around the opening of the body through a gasket, closes the opening, and is adjacent to the power card. As pressure is applied on the lamination unit in the laminating direction of the lamination unit, the opening is sealed by the metal plate.

Preferably, the power converter explained in the examples is applied to an electric vehicle, a hybrid vehicle, or a fuel-cell vehicle.

Specific examples of the invention have been explained in detail, but are examples only, and do not limit the scope of the claims. The techniques described in the scope of claims include various modifications and changes of the specific examples described above. The technical elements explained in this specification and the drawings achieve technical utility alone or as various combinations, and are not limited to the combinations described in the claims on filing. Moreover, the techniques described as examples in the specification and the drawings are able to achieve a plurality of objectives simultaneously and have technical utility by achieving one of the objectives.

The invention claimed is:

1. A power converter comprising:
 a plurality of power cards, each of the power cards housing a semiconductor element;
 a plurality of coolers laminated with the plurality of power cards, each of the coolers facing the respective power card, each of the coolers including:
  a body which is made of resin, the body having an opening that is provided in a side surface of the cooler that faces the adjacent power card;
  a gasket; and
  a metal plate, in which a surface on one side configured to close the opening through the gasket, and the other surface faces the adjacent card; and
 a pressure member configured to apply a pressure in a laminating direction on a lamination unit, the plurality of power cards and the plurality of coolers being laminated in the lamination unit, and the opening being sealed by the metal plate respectively by pressure applied by the pressure member on the lamination unit.

2. The power converter according to claim 1, wherein each of the power cards includes an insulating member on a surface facing the cooler.

3. The power converter according to claim 1, wherein the metal plate is provided with a plurality of fins on the surface on one side.

4. The power converter according to claim 1, wherein the metal plate is fixed to the respective power card before the power card and the body are assembled.

5. The power converter according to claim 1, wherein the plurality pf power cards and the plurality of coolers are alternately laminated.

6. The power converter according to claim 1, wherein
each of the coolers is provided with two protrusion portions integrally formed with and extending from the the respective body in the laminating direction,
the two protrusion portions are positioned so as to sandwich the respective power card in a direction perpendicular to the laminating direction, and
a distal end of each of the two protrusion portions is connected to another neighboring cooler, and inner spaces of the two neighboring coolers communicate with each other.

7. The power converter according to claim 1, wherein
the body has a groove that houses the gasket around the opening, and
a height of an edge of the groove on an opening side is larger than a height of an edge of the groove at an outer side.

8. The power converter according to claim 1, wherein
the gasket includes a plurality of protrusions surrounding the opening multiple times.

* * * * *